United States Patent
Nishizawa

(10) Patent No.: US 8,633,637 B2
(45) Date of Patent: Jan. 21, 2014

(54) RESONATOR ELEMENT, RESONATOR, PHYSICAL QUANTITY SENSOR, AND ELECTRONIC EQUIPMENT THAT HAVE STEPS ON A SIDE SURFACE OF A VIBRATING ARM

(75) Inventor: Ryuta Nishizawa, Suwa (JP)

(73) Assignee: Seiko Epson Corporation (JP)

( * ) Notice: Subject to any disclaimer, the term of this patent is extended or adjusted under 35 U.S.C. 154(b) by 530 days.

(21) Appl. No.: 12/960,783

(22) Filed: Dec. 6, 2010

(65) Prior Publication Data

US 2011/0140575 A1   Jun. 16, 2011

(30) Foreign Application Priority Data

Dec. 10, 2009  (JP) .................................. 2009-280173
Oct. 5, 2010   (JP) .................................. 2010-225423

(51) Int. Cl.
*H03H 9/19* (2006.01)
*H03H 9/215* (2006.01)

(52) U.S. Cl.
CPC ...................................... *H03H 9/19* (2013.01)
USPC ......................................................... 310/370

(58) Field of Classification Search
CPC ................................. H03H 9/21; H03H 9/215
USPC ......................................................... 310/370
See application file for complete search history.

(56) References Cited

U.S. PATENT DOCUMENTS

| | | | |
|---|---|---|---|
| 5,343,749 A | 9/1994 | Macy | |
| 5,408,876 A | 4/1995 | Macy | |
| 5,522,249 A | 6/1996 | Macy | |
| 6,791,243 B2* | 9/2004 | Kawashima | 310/370 |
| 6,898,832 B2 | 5/2005 | Kawashima | |
| 6,911,765 B2* | 6/2005 | Kawashima | 310/370 |
| 7,412,886 B2* | 8/2008 | Dalla Piazza et al. | 73/504.16 |
| 7,673,511 B2* | 3/2010 | Yamamoto | 73/504.16 |
| 8,191,216 B2* | 6/2012 | Yamazaki et al. | 29/25.35 |
| 8,373,333 B2* | 2/2013 | Yamada | 310/368 |
| 2012/0326570 A1* | 12/2012 | Nishizawa et al. | 310/366 |

FOREIGN PATENT DOCUMENTS

| | | | |
|---|---|---|---|
| JP | 05-256723 | | 10/1993 |
| JP | 3646258 | | 2/2005 |
| JP | 2006-177945 | | 7/2006 |
| JP | 2008-072770 | | 3/2008 |
| JP | 2011205418 A | * | 10/2011 |
| JP | 2011220922 A | * | 11/2011 |
| JP | 2013009166 A | * | 1/2013 |

\* cited by examiner

*Primary Examiner* — Jaydi San Martin
(74) *Attorney, Agent, or Firm* — Harness, Dickey & Pierce, P.L.C.

(57) ABSTRACT

A resonator element includes: a base part; plural vibrating arms extended from the base part, each having a first principal surface and a second principal surface opposed to each other and a first side surface and a second side surface connecting the first principal surface and the second principal surface and opposed to each other, the first side surface of at least one vibrating arm of the plural vibrating arms having a first step part provided from the first principal surface side and a second step part provided from the second principal surface side; a first electrode provided on the second side surface of the vibrating arm; a second electrode provided in a position opposed to the first electrode of the first step part; and a third electrode provided in a position opposed to the first electrode of the second step part.

14 Claims, 8 Drawing Sheets

RESONATOR ELEMENT, RESONATOR, PHYSICAL QUANTITY SENSOR, AND ELECTRONIC EQUIPMENT THAT HAVE STEPS ON A SIDE SURFACE OF A VIBRATING ARM

BACKGROUND

1. Technical Field

The present invention relates to a resonator element provided with step parts on the side surfaces of the vibrating arms, and a resonator, a physical quantity sensor, and electronic equipment including the resonator element.

2. Related Art

In related art, in a tuning fork resonator including a vibrating arm having excitation electrodes and a vibrating arm having detection electrodes, there is a form in which the sectional shapes of the vibrating arms are substantially rectangular shapes, electrodes are provided on front and rear surfaces and both side surfaces of the vibrating arms, flexural vibrations of the vibrating arms are generated, and a natural resonance frequency is oscillated.

Further, as another form, when the vibrating arm is in in-plane vibration by an excitation signal, if the shaft of the vibrating arm in the extending direction is rotated as a detection shaft, the vibrating arm is brought into out-of-plane vibration by Coriolis force. Since the amplitude of the out-of-plane vibration is proportional to the rotational speed of the tuning fork resonator, there is an angular velocity sensor (physical quantity sensor) that can detects it as an angular velocity.

The detection electrodes are divisionally provided on both side surfaces in the in-plane vibration direction of one vibration arm, and the opposed detection electrodes and the detection electrodes on the same side surfaces have different polarities (for example, see Patent Document 1 (JP-A-5-256723)).

Recently, electronic equipment has tended to be smaller and the smaller size of the tuning fork resonator element has been demanded. If the widths of the vibrating arms are made narrower as the resonator element is made smaller, the widths of the electrodes may not taken larger, and the electrode area decreases and the electric field applied to the vibrating arm thereby becomes weaker as it is nearer the center of the section of the vibrating arm.

There has been a problem of the resonator element that the vibration loss becomes greater due to the deterioration of the electric field efficiency.

Further, in the case where the resonator element is used as an angular velocity sensor, in Patent Document 1, the electric field is linear and electric charge is easier to be detected because the detection electrodes are opposed, however, it is necessary to divide the detection electrodes on both side surfaces of the vibrating arm. These detection electrodes are formed by means of sputtering or the like from a direction along the side surfaces, and it is difficult to form the electrodes divisionally in the side surface direction (the thickness direction of the resonator element).

Furthermore, since the distance between the opposed detection electrodes depends on the widths of the vibrating arms themselves, the distance between the electrodes may not simply be made smaller. The generated charge due to the vibration produced by Coriolis force is proportional to the capacitance between electrodes and the capacitance is inversely proportional to the distance between electrodes, and thus, there is a problem that, when the distance between electrodes is larger, the generated charge is smaller and the detection sensitivity is lower.

SUMMARY

An advantage of some aspects of the invention is to solve at least a part of the problems described above and the invention can be implemented as the following forms or application examples.

Application Example 1

According to this application example, there is provided a resonator element extended on a plane formed by a first axis and a second axis orthogonal to the first axis on the plane and having a first principal surface and a second principal surface opposed to each other and side surfaces connecting to the first principal surface and the second principal surface, and the resonator element has a base part, plural vibrating arms extended from the base part in the first axis direction, a first step part formed from the first principal surface side and a second step part formed from the second principal surface side on one side surface in the second axis direction of at least one vibrating arm of the plural vibrating arms, and includes a first electrode formed on the other side surface of the vibrating arm, a second electrode formed on a side surface of the first step part opposed to the first electrode; and a third electrode formed on a side surface of the second step part opposed to the first electrode, wherein a direction of an electric field generated between the first electrode and the second electrode and a direction of an electric field generated between the first electrode and the third electrode are opposite to each other.

Further, as another aspect, a resonator element according to the application example includes a base part, and plural vibrating arms extended from the base part, each having a first principal surface and a second principal surface opposed to each other and a first side surface and a second side surface connecting the first principal surface and the second principal surface and opposed to each other, the first side surface of at least one vibrating arm of the plural vibrating arms having a first step part provided from the first principal surface side and a second step part provided from the second principal surface side, a first electrode provided on the second side surface of the vibrating arm, a second electrode provided in a position opposed to the first electrode of the first step part, and a third electrode provided in a position opposed to the first electrode of the second step part.

Furthermore, as another aspect, in the resonator element according to the application example, a direction of an electric field generated between the first electrode and the second electrode and a direction of an electric field generated between the first electrode and the third electrode are opposite to each other.

According to these aspects, by providing the first step part and the second step part on the vibrating arm, the distances between electrodes between the first electrode and the second and the third electrodes can be made smaller compared to the case without the step parts, and the electric field efficiency can be improved.

Further, in the case where the resonator element is used as an angular velocity sensor, because the generated charge due to out-of-plane vibration produced by Coriolis force is proportional to the capacitance between electrodes and the capacitance is inversely proportional to the distance between electrodes, by making the distance between electrodes smaller, the generated charge can be larger and the detection sensitivity can be made higher. Furthermore, by using the vibrating arm for detection for exclusive use, the areas of the detection electrodes can be made larger, and thereby, the detection sensitivity can be made even higher.

In addition, while four detection electrodes are provided on one detection arm in the above described related art, it is necessary to provide only three detection electrodes, and wiring of the first electrode, the second electrode, and the third electrode can be simplified. Furthermore, by providing the first step part and the second step part, the surface areas for electrode formation are increased, and there are advantages that the planar distances between the respective electrodes can be made larger and the parasitic capacities between the electrodes can be made smaller.

In addition, disconnection and short of the detection electrodes can be prevented and the manufacturing yield can be improved.

Further, by providing the first step part and the second electrode part, physical thresholds is produced, and there is an advantage that it can be easier to divisionally form the second electrode and the third electrode in the thickness direction.

Application Example 2

In the resonator element according to the above application example, it is preferable that the number of the vibrating arms is two, and the first step part and the second step part are formed in positions near the base part in the respective extending directions of the two vibrating arms.

Further, as another aspect, in the resonator element according to the above application example, it is preferable that the vibrating arm includes excitation electrodes and detection electrodes, and the first electrode to the third electrode are used for the detection electrodes.

In the configuration, for example, in the case where the resonator element is used as an angular velocity sensor, the detection electrode can be formed in the root part of the vibrating arm and the electrode for excitation can be formed in the end part. That is, the reed has a tuning fork shape with two vibrating arms, and the CI value can be made smaller and the current consumption for driving can be reduced.

Application Example 3

In the resonator element according to the above application example, it is preferable that two of the vibrating arms are extended from one end part in the first axis direction of the base part and the other end part opposed to the one end part, respectively, and the first step part and the second step part are formed on one of the vibrating arm extended to the one end part and the vibrating arm extended to the other end part.

Further, as another aspect, in the resonator element according to the above application example, it is preferable that two of the vibrating arms are extended from one end part of the base part and the other end part opposed to the one end part, respectively.

The resonator element having the configuration has an H-shape in which the tuning forks of the one end part and the other end part in the first axis direction are coupled in the base part. Accordingly, when the resonator element is used as an angular velocity sensor, if one tuning fork is used for driving (excitation) and another tuning fork is used for detection, the excitation electrodes and the detection electrodes can be separated, and the areas of the detection electrodes can be made larger and the detection sensitivity can be made higher.

Application Example 4

In the resonator element according to the above application example, in the case where the first step part and the second step part are formed by etching, it is preferable that the first step part and the second step part are formed on the side surface in a direction at a higher etching rate.

Further as another aspect, in the resonator element according to the above application example, it is preferable that an etching rate is higher at the first side surface side than at the second side surface side.

For example, in the case where the resonator element is made of quartz, there is etching anisotropy according to the crystalline structure of quartz. In this case, the side surface in the thickness direction can be etched nearly at a right angle relative to the principal surface in the direction at the higher etching rate, and the side surface is etched in an oblique direction relative to the principal surface in the direction at the lower etching rate. Therefore, by forming the first step part and the second step part on the side surface in the direction at the higher etching rate, the distances between opposed electrodes between the first electrode and the second and third electrodes can be made smaller, the electric field efficiency can be made higher, and, if the resonator element is used as an angular velocity sensor, the detection sensitivity can be made higher.

Application Example 5

In the resonator element according to the above application example, in the case where the first step part and the second step part are formed on the parallel plural vibrating arms, it is preferable that the step parts are formed on the side surfaces in the same direction of the respective vibrating arms.

Further, as another aspect, in the resonator element according to the above application example, it is preferable that, in each of the plural vibrating arms, the first step part and the second step part are provided on the first side surface.

For example, in the case where the resonator element is used as an angular velocity sensor, regarding the plural vibrating arms that perform out-of-plane vibration by Coriolis force, the adjacent vibrating arms vibrate in the alternate directions. Accordingly, by forming the first step part and the second step part in the same direction of the respective vibrating arms, if the absolute values of the generated charge are combined and output, the detection sensitivity can be made even higher.

Application Example 6

In the resonator element according to the above application example, it is preferable that the plural vibrating arms perform out-of-plane vibration by Coriolis force when the resonator element rotates around the detection axis.

For example, in the case where the resonator element is used as an angular velocity sensor, by providing the first step part and the second step part in the detection arm, the distance between electrodes between the first electrode and the second and the third electrodes can be made smaller, the generated charge due to the out-of-plane vibration produced by Coriolis force is increased and the detection sensitivity can be made higher.

Application Example 7

A resonator element according to this application example includes the resonator element according to any one of the application examples, and a package containing the resonator element.

According to the application example, by using the resonator element, the resonator with improved electric field efficiency can be realized.

Application Example 8

An angular velocity sensor according to the application example includes the resonator element according to any one of the application examples, an excitation unit configured to excite the vibrating arm within a plane, and a detection unit configured to detect the out-of-plane vibration.

Further, as another aspect, a physical quantity sensor according to the application example includes the resonator element according to any one of the application examples.

According to the application example, because the above described resonator element is used, for example, an angular velocity sensor with high detection sensitivity can be realized.

Application Example 9

Electronic equipment according to the application example includes the resonator element according to any one of the application examples.

According to the application example, electronic equipment exerting the effects of the above application examples by including the resonator element can be provided.

BRIEF DESCRIPTION OF THE DRAWINGS

The invention will be described with reference to the accompanying drawings, wherein like numbers reference like elements.

FIG. 14A is a plan view and FIG. 14B is a sectional view of FIG. 14A.

DESCRIPTION OF EXEMPLARY EMBODIMENTS

Hereinafter, embodiments of the invention will be described with reference to the drawings.

The drawings referred to in the description as below are schematic diagrams with members and parts in different longitudinal and lateral scaling from actual one for convenience of illustration.

Embodiment 1

Figure 1:
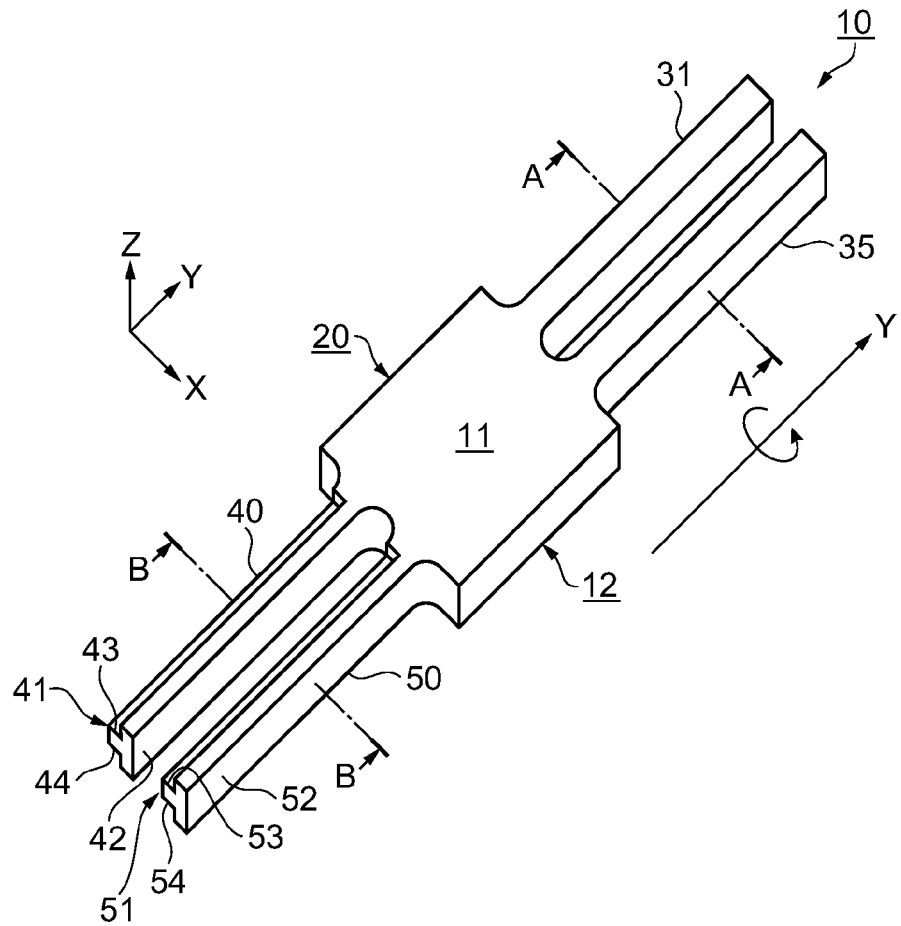
FIG. 1 is a perspective view showing a resonator element according to embodiment 1.
Figure 2:
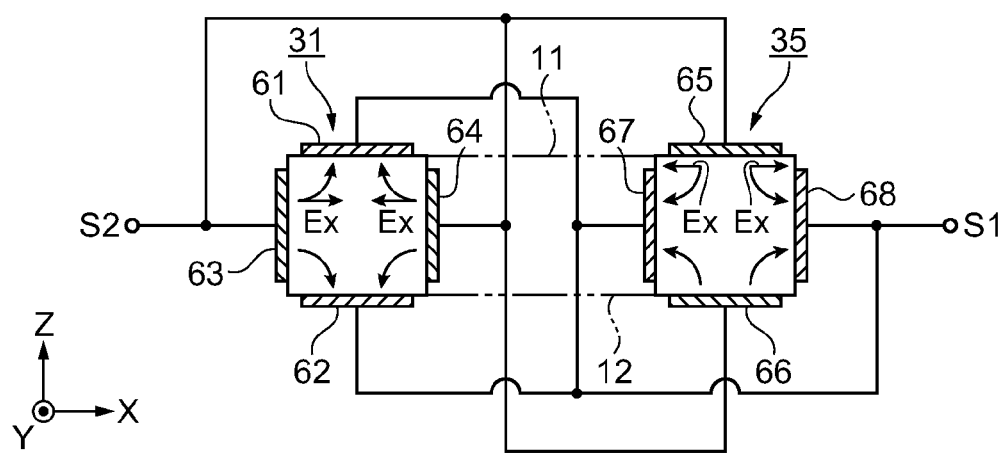
FIG. 2 is a sectional view showing A-A section of FIG. 1.
Figure 3:
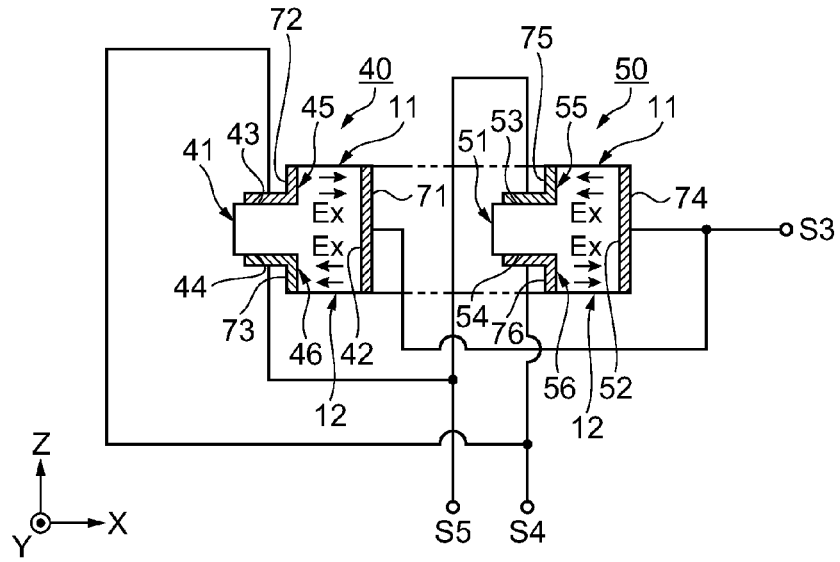
FIG. 3 is a sectional view showing B-B section of FIG. 1.

FIG. 1 is a perspective view showing a resonator element according to embodiment 1, FIG. 2 is a sectional view showing A-A section of FIG. 1, and FIG. 3 is a sectional view showing B-B section of FIG. 1. First, an overall configuration of the resonator element will be explained with reference to FIG. 1.

A resonator element 10 of the embodiment is extended on a plane formed by the X-axis (the second axis) and the Y-axis (the first axis) orthogonal to the X-axis on the plane, and has a first principal surface 11 and a second principal surface 12 opposed to each other. The axis perpendicular to the first principal surface 11 and the second principal surface 12 is the Z-axis. In the case where the resonator element 10 is made of quartz, the X-axis is the electric axis, the Y-axis is the machine axis, and the Z-axis is the optical axis. The resonator element 10 includes a first vibrating arm 31 and a second vibrating arm 35 extended in +Y direction and a third vibrating arm 40 and a fourth vibrating arm 50 extended in −Y direction from the base part 20.

Accordingly, the base part 20 and the first vibrating arm 31 and the second vibrating arm 35 form a tuning fork resonator element, and the base part 20 and the third vibrating arm 40 and the fourth vibrating arm 50 form a tuning fork resonator element. The two tuning fork resonator elements are coupled in the base part 20, and the resonator element having the configuration can be referred to as "H-shaped resonator element".

Note that the first vibrating arm 31 and the second vibrating arm 35 are formed in parallel to each other, in the same length, and in the same sectional shape, and the third vibrating arm 40 and the fourth vibrating arm 50 are formed in parallel to each other, in the same length, and in the same sectional shape. In the embodiment, the first vibrating arm 31 and the second vibrating arm 35 are drive arms (excitation arms), and the third vibrating arm 40 and the fourth vibrating arm 50 are detection arms. Accordingly, as below, the third vibrating arm 40 is referred to as "the first detection arm 40" and the fourth vibrating arm 50 is referred to as "the second detection arm 50" in explanation.

On the first detection arm 40, a first step part 43 drilled from the first principal surface 11 to a side surface (first side surface) 41 in the −X direction and a second step part 44 drilled from the second principal surface 12 opposed to the first principal surface 11 to the side surface 41 in the −X direction are formed. The first step part 43 and the second step part 44 are formed over the nearly entire length from the end part to the root part of the first detection arm 40 in the −X direction.

On the second detection arm 50, a third step part 53 drilled from the first principal surface 11 to a side surface (first side surface) 51 in the −X direction and a fourth step part 54 drilled from the second principal surface 12 to the side surface 51 are formed. The third step part 53 and the fourth step part 54 are formed over the nearly entire length from the end part to the root part of the second detection arm 50 in the −X direction. The sectional shapes in the X direction of the first detection arm 40 and the second detection arm 50 are the same.

Subsequently, configurations of electrodes formed on the first vibrating arm 31 and the second vibrating arm 35 will be explained with reference to FIG. 2. The first vibrating arm 31 and the second vibrating arm 35 have square or rectangular sectional shapes. On the first vibrating arm 31, electrodes 61, 62 and electrodes 63, 64 opposed to each other are formed. Further, on the second vibrating arm 35, electrodes 65, 66 and electrodes 67, 68 opposed to each other are formed.

Further, the electrodes 61, 62, 67, 68 are extended along the surfaces of the first vibrating arm 31 and the second vibrating arm 35 and wired in a connection terminal part S1. Furthermore, the electrodes 63, 64, 65, 66 are extended along the surfaces of the first vibrating arm 31 and the second vibrating arm 35 and wired in a connection terminal part S2. Though not shown in the drawing, the connection terminal parts S1, S2 are provided on the first principal surface 11 or the second principal surface 12.

The electrodes 61, 62, 67, 68 and the electrodes 63, 64, 65, 66 are excitation electrodes to which excitation signals having different polarities from each other are input.

Next, configurations of electrodes formed on the first detection arm 40 and the second detection arm 50 will be explained with reference to FIG. 3. On the first detection arm 40, a detection electrode 71 as a first electrode formed on the entire of a side surface (that is, +X side surface, the second side surface) 42 opposite to the first step part 43 and the second step part 44, a detection electrode 72 as a second electrode formed on a side surface 45 opposed to the detection electrode 71 of the first step part 43, and a detection electrode 73 as a third electrode formed on a side surface 46 opposed to the detection electrode 71 of the second step part 44 are formed.

Note that, as shown in FIG. 3, the detection electrode 72 is formed to be continuous from the side surface 45 to the first step part 43, and the detection electrode 73 is formed to be continuous from the side surface 46 to the second step part 44.

On the second detection arm 50, a detection electrode 74 as a fourth electrode formed on the entire of a side surface (that is, +X side surface, the second side surface) 52 opposite to the third step part 53 and the fourth step part 54, a detection electrode 75 as a fifth electrode formed on a side surface 55 opposed to the detection electrode 74 of the third step part 53, and a detection electrode 76 as a sixth electrode formed on a side surface 56 opposed to the detection electrode 74 of the second step part 54 are formed.

Note that, as shown in FIG. 3, the detection electrode 75 is formed to be continuous from the side surface 55 to the third step part 53, and the detection electrode 76 is formed to be continuous from the side surface 56 to the fourth step part 54.

The detection electrodes 71, 74 are wired to a connection terminal part S3, the detection electrodes 72, 76 are wired to a connection terminal part S4, and the detection electrodes 73, 75 are wired to a connection terminal part S5. Though not shown in the drawing, the connection terminal parts S3, S4, S5 are provided on the same principal surface as the first principal surface 11 or the second principal surface 12 on which the above described connection terminal parts S1, S2 are provided.

The detection electrodes 71, 74, the detection electrodes 72, 76, and the detection electrodes 73, 75 are arranged so that the respective opposed detection electrodes can have different polarities for efficient detection of generated charge due to the vibration produced by Coriolis force.

Next, the action of the resonator element 10 in the embodiment will be explained. First, the excitation signals are input to the electrodes 61 to 68. FIG. 2 shows the case where positive potentials are applied to the electrodes 63, 64, 65, 66 and negative potentials are applied to the electrodes 61, 62, 67, 68. In this regard, as shown in the drawing, electric fields are generated to depict curves in arrow directions, and linear electric field components Ex act between the opposed electrodes. The first vibrating arm 31 and the second vibrating arm 35 have opposite directions of the electric field components Ex, and the first vibrating arm 31 and the second vibrating arm 35 displace in the −X direction and +X direction, respectively. Further, by inputting alternating current signals to the respective electrodes, the first vibrating arm 31 and the second vibrating arm 35 continue flexural vibrations in the ±X directions.

When the excitation signals are input, if the resonator element 10 is rotated around the Y-axis (detection axis), Coriolis force is generated in a direction at a right angle relative to the vibration direction (in-plane vibration) of the first vibrating arm 31 and the second vibrating arm 35, and the first detection arm 40 and the second detection arm 50 perform out-of-plane vibration in the ±Z directions.

FIG. 3 shows the case where the detection electrodes 71, 74 are used as GND electrodes, the detection electrodes 72, 76 are at the positive potentials, and the detection electrodes 73, 75 are at the negative potentials. At the out-of-plane vibration by Coriolis force, the linear electric field components Ex are generated between the opposed electrodes as shown in the drawing. Further, by measuring the generated amounts of charge, the angular velocity of the resonator element 10 can be detected.

Therefore, according to the embodiment, by providing the first step part 43 and the second step part 44 on the first detection arm 40 and the third step part 53 and the fourth step part 54 on the second detection arm 50, the distance between opposed electrodes between the detection electrode 71 and the detection electrodes 72, 73 and the distance between opposed electrodes between the detection electrode 74 and the detection electrodes 75, 76 can be made smaller than in the case without the step parts.

The generated charge due to out-of-plane vibration produced by Coriolis force is proportional to the capacitance between electrodes and the capacitance is inversely proportional to the distance between electrodes, and thus, by making the distance between electrodes smaller, the generated charge can be larger and the detection sensitivity can be made higher. Further, the first detection arm 40 and the second detection arm 50 are used exclusively for detection, and the opposed areas of the detection electrodes 72, 73 and the detection electrode 71 and the opposed areas of the detection electrodes 75, 76 and the detection electrode 74 can be made larger, and thereby, the detection sensitivity can be made even higher.

Further, while four detection electrodes are provided on one detection arm in the above described related art, it is necessary to provide only three detection electrodes, and wiring of the respective detection electrodes can be simplified. Furthermore, by providing the first step part 43 and the second step part 44 and the third step part 53 and the fourth step part 54 and using the detection arms for exclusive use, the surface areas for electrode formation are increased, and there are advantages that the planar distances between the respective electrodes can be made larger and the parasitic capacities between the electrodes can be made smaller.

In addition, disconnection and short of the detection electrodes can be suppressed and the manufacturing yield can be improved.

Further, since the first step part 43 and the second step part 44, the third step part 53 and the fourth step part 54 are formed in the respective same directions of the first detection arm 40 and the second detection arm 50, if the absolute values of generated charge are combined and output, the detection sensitivity can be made higher.

Furthermore, by providing the first step part 43 and the second step part 44, the third step part 53 and the fourth step part 54 between the detection electrodes 72, 73 and the detection electrodes 75, 76, physical thresholds are produced, and there is an advantage that it can be easier to divisionally form the detection electrodes in the side surface direction (thickness direction).

Modified Example of Embodiment 1

Subsequently, a modified example of embodiment 1 will be explained. In the modified example, the first and second step parts 43 and 44 and the third and fourth step parts 53 and 54 are provided in the +X direction of the first detection arm 40 and the second detection arm 50. Accordingly, the differences from embodiment 1 will be centered in the explanation. Further, the same signs are assigned to the parts having the same functions.

Figure 4:
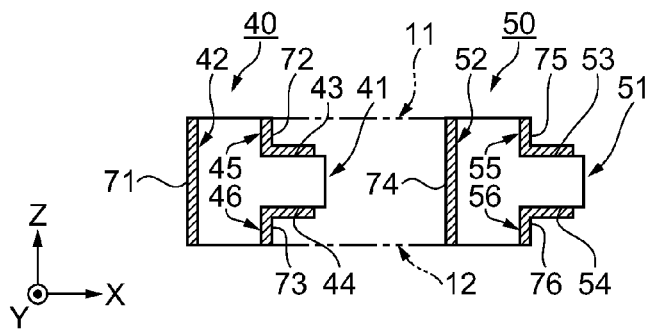
FIG. 4 is a sectional view showing a first detection arm and a second detection arm according to a modified example of embodiment 1.

FIG. 4 is a sectional view showing the first detection arm and the second detection arm according to the modified example. Note that FIG. 4 is the sectional view corresponding to the B-B section position of FIG. 1. On the first detection arm 40, the first step part 43 drilled from the first principal surface 11 to the side surface 41 in the +X direction and the second step part 44 drilled from the second principal surface 12 to the side surface 41 in the +X direction are formed. The first step part 43 and the second step part 44 are formed over the nearly entire length from the end part to the root part of the first detection arm 40.

On the second detection arm 50, the third step part 53 drilled from the first principal surface 11 to the side surface 51 in the +X direction and the fourth step part 54 drilled from the second principal surface 12 to the side surface 51 are formed. The third step part 53 and the fourth step part 54 are formed over the nearly entire length from the end part to the root part of the second detection arm 50. The sectional shapes in the X direction of the first detection arm 40 and the second detection arm 50 are the same.

The detection electrodes formed on the first detection arm 40 and the second detection arm 50 have the same configurations (that is, the detection electrodes having the same signs are commonly wired) as those in embodiment 1 (see FIG. 3), and their explanation will be omitted.

Even by employing the configuration, the same advantages over the structure without step parts as those of embodiment 1 can be obtained. However, in the case where the resonator element 10 is made of quartz and molded using etching, it is necessary to consider the formation direction of the step parts because there is a difference in etching rate due to crystalline anisotropy of quartz. Accordingly, the formation direction of the step parts will be explained.

Figure 5A:
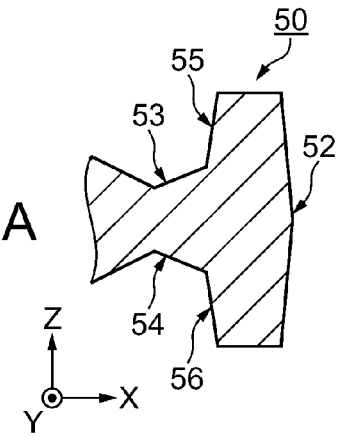
FIGS. 5A and 5B are partial sectional views showing a difference of molding of the detection arms depending on a formation direction of step parts.
Figure 5B:
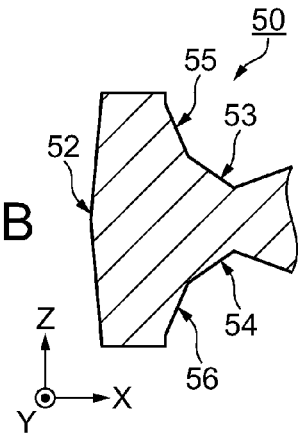

FIGS. 5A and 5B are partial sectional views showing a difference of molding of the detection arms depending on the formation direction of the step parts, FIG. 5A shows the case where the step parts are provided in the −X direction and FIG. 5B shows the case where the step parts are provided in the +X direction. Note that FIGS. 5A and 5B show enlarged results of etching simulations. The second detection arm 50 will be explained as an example. In the case where the resonator element 10 is made of quartz, the etching rate in the −X direction is high and the etching rate in the +X direction is low.

Accordingly, in comparison between FIG. 5A and FIG. 5B, when the third step part 53 and the fourth step part 54 are provided in the +X direction as shown in FIG. 5B, the side surface 55 at the third step part 53 side and the side surface 56 at the fourth step part 54 side are gently inclined. On the other hand, when the third step part 53 and the fourth step part 54 are provided in the −X direction as shown in FIG. 5A, the side surface 55 at the third step part 53 side and the side surface 56 at the fourth step part 54 side are inclined nearly at a right angle relative to the first principal surface 11 or the second principal surface 12.

Therefore, in FIG. 5B, the distances between the side surface 52 and the side surface 55 and between the side surface 52 and the side surface 56 are larger than those in the case where the step parts are provided in the −X direction. Thus, the distances between electrodes between the respective opposed detection electrodes are larger and the detection sensitivity is lower.

Therefore, by forming the first and second step parts 43 and 44 and the third and fourth step parts 53 and 54 on the side surfaces at the higher etching rates (−X direction) as shown in FIG. 5A, the detection sensitivity can be made even higher. Note that, in FIG. 5A, the front surface of the side surface 52 has a gentle arch shape, however, when the side surface 52 is at a right angle relative to the first principal surface 11 or the second principal surface 12 by over-etching, the distances between the side surface 52 and the side surface 55 and between the side surface 52 and the side surface 56 can be made even shorter, and the detection sensitivity can be made even higher.

Embodiment 2

Subsequently, a resonator element according to embodiment 2 will be explained with reference to the drawings. While the above described embodiment 1 has the H-shaped tuning fork configuration, embodiment 2 has a double-turning fork configuration.

Figure 6:
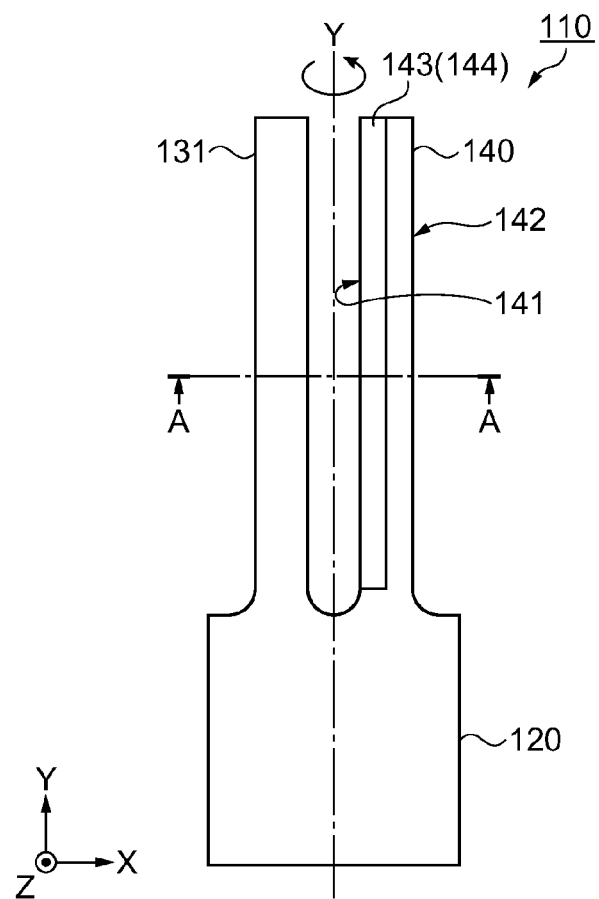
FIG. 6 is a plan view showing a resonator element according to embodiment 2.
Figure 7:
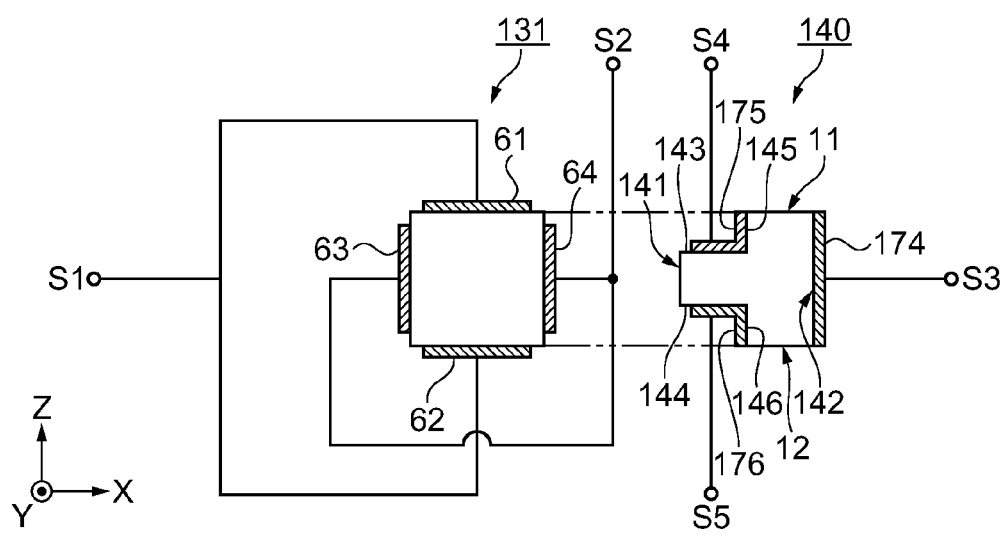
FIG. 7 is a sectional view showing A-A section of FIG. 6.

FIG. 6 is a plan view showing the resonator element according to embodiment 2, and FIG. 7 is a sectional view showing A-A section of FIG. 6. The resonator element 110 includes two vibrating arms 131, 140 extended from a base part 120 in parallel in the +Y direction. Here, the vibrating arm 131 has a rectangular sectional shape and excitation electrodes, and corresponds to the first vibrating arm 31 of the above described embodiment 1 (see FIGS. 1 and 2). The vibrating arm 140 has a configuration having step parts and detection electrodes as a detection arm, and corresponds to the second detection arm 50 of embodiment 1 (see FIGS. 1 and 3). Accordingly, the vibrating arm 140 will be referred to as "detection arm 140" for explanation.

Next, the sectional shapes of the vibrating arm 131 and the detection arm 140 and wiring configurations of the electrodes will be explained with reference to FIG. 7. On the vibrating arm 131, the opposed electrodes 61, 62 and electrodes 63, 64 are formed. Further, the electrodes 61, 62 are extended along the surfaces of the vibrating arm 131 and wired in the connection terminal part S1. Furthermore, the electrodes 63, 64 are extended along the surfaces of the vibrating arm 131 and wired in the connection terminal part S2. Though not shown in the drawing, the connection terminal parts S1, S2 are provided on the first principal surface 11 or the second principal surface 12.

The electrodes 61, 62, and the electrodes 63, 64, are excitation electrodes to which excitation signals having different polarities from each other are input.

On the detection arm 140, a first step part 143 drilled from the first principal surface 11 to a side surface (first side surface) 141 in the −X direction and a second step part 144 drilled from the second principal surface 12 opposed to the first principal surface 11 to the side surface 141 are formed. The first step part 143 and the second step part 144 are formed over the nearly entire length from the end part to the root part of the detection arm 140 in the −X direction.

On the detection arm 140, a detection electrode 174 as a first electrode formed on the entire of a side surface 142 (that is, +X side surface, the second side surface) opposite to the first step part 143 and the second step part 144, a detection electrode 175 as a second electrode formed on a side surface 145 opposed to the detection electrode 174 of the first step part 143, and a detection electrode 176 as a third electrode formed on a side surface 146 opposed to the detection electrode 174 of the second step part 144 are formed.

Note that, as shown in FIG. 7, the detection electrode 175 is formed to be continuous from the side surface 145 to the first step part 143, and the detection electrode 176 is formed to be continuous from the side surface 146 to the second step part 144.

The detection electrode 174 is wired to the connection terminal part S3, the detection electrode 175 is wired to the connection terminal part S4, and the detection electrodes 176 is wired to the connection terminal part S5. Though not shown in the drawing, the connection terminal parts S3, S4, S5 are provided on the same principal surface of the first principal surface 11 or the second principal surface 12 on which the above described connection terminal parts S1, S2 are provided.

The detection electrode 174, the detection electrode 175, and the detection electrode 176 are arranged so that the opposed detection electrodes can respectively have different polarities for efficient detection of generated charge due to the vibration produced by Coriolis force.

Next, the action of the resonator element 110 in the embodiment will be explained. First, the excitation signals are input to the electrodes 61 to 64. Note that the vibrating arm 131 has the same electrode configurations as those of embodiment 1 (see FIG. 2), and, as shown in the drawing, electric fields are generated to depict curves in arrow directions, linear electric field components Ex act between the opposed electrodes, and the end parts displace in the −X direction. Further, by inputting alternating current signals to the respective electrodes, the vibrating arm 131 and the detection arm 140 continue in-plane flexural vibration in the ±X directions due to the tuning fork effect.

When the excitation signals are input, if the resonator element 110 is rotated around the Y-axis (detection axis), Coriolis force is generated in a direction at a right angle relative to the vibration direction (in-plane vibration) of the vibrating arm 131 and the detection arm 140, and the vibrating arm 131 and the detection arm 140 perform out-of-plane vibration in the ±Z directions.

Note that, since the detection arm 140 has the same electrode configurations as those of embodiment 1 (see FIG. 3), at the out-of-plane vibration by Coriolis force, the linear electric field components Ex are generated between the opposed electrodes as shown in the drawing. Further, by measuring the generated amounts of charge, the angular velocity of the resonator element 110 can be detected.

Therefore, according to the embodiment, because of the double-arm configuration of the vibrating arm 131 and the detection arm 140, the structure is simple. Further, the excitation electrodes (electrodes 61 to 64) and the detection electrodes 174 to 176 are separated, and thus, the wiring of the respective electrodes can be simplified. Furthermore, by using the detection arm for exclusive use, the surface areas for electrode formation are increased, and there are advantages that the planar distances between the respective electrodes can be made larger and the parasitic capacities between the electrodes can be made smaller.

In addition, disconnection and short of the electrodes can be suppressed and the manufacturing yield can be improved.

Embodiment 3

Subsequently, embodiment 3 will be explained with reference to the drawings. While the above described embodiment 2 has the vibrating arm and the detection arm separately, embodiment 3 has two vibrating arms and a first step part and a second step part formed in positions near the base part in the respective extending directions of the two vibrating arms. Accordingly, the differences from embodiment 2 are centered for explanation. The same signs are assigned to the common parts of embodiment 1 and embodiment 2.

Figure 8:
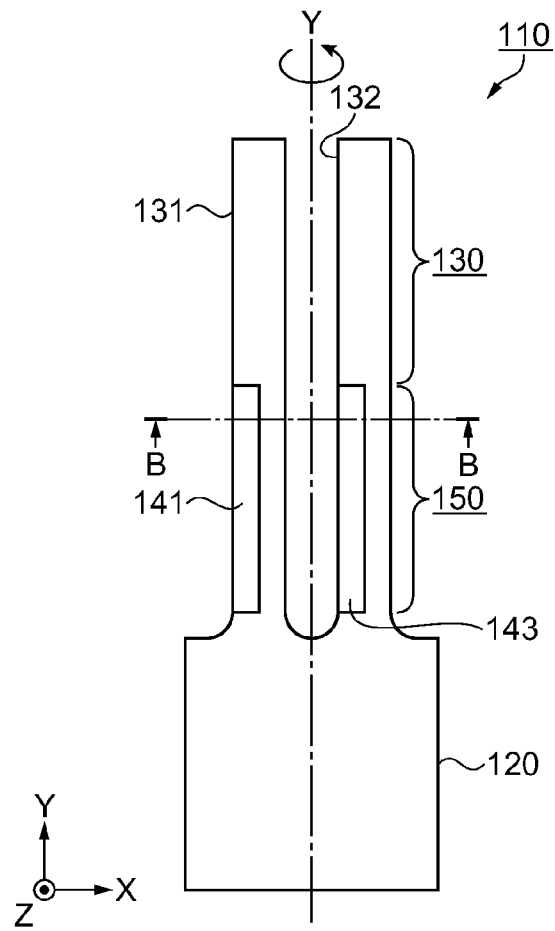
FIG. 8 is a plan view showing a resonator element according to embodiment 3.
Figure 9:
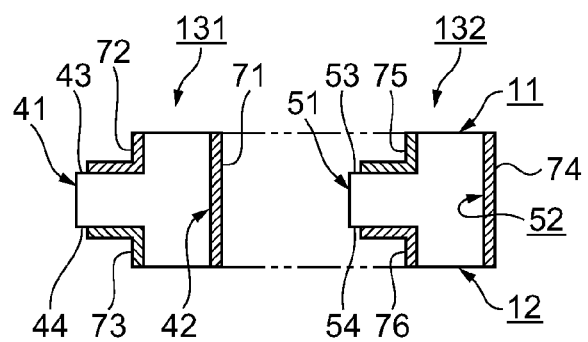
FIG. 9 is a sectional view showing B-B section of FIG. 8.

FIG. 8 is a plan view showing a resonator element according to embodiment 3, and FIG. 9 is a sectional view showing B-B section of FIG. 8. In FIGS. 8 and 9, the resonator element 110 includes two vibrating arms 131, 132 extended from the base part 120 in parallel in the +Y direction. Here, the vibrating arms 131, 132 in the end direction are vibrating arm parts 130 having rectangular sectional shapes and excitation electrodes, and corresponding to the first vibrating arm 31 and the second vibrating arm 35 of the above described embodiment 1 (see FIGS. 1 and 2).

The configurations of the sectional shapes of the respective vibrating arm parts 130 of the vibrating arms 131, 132 and the configurations of the electrodes (excitation electrodes) are the same as those in the above described embodiment 1 (see FIG. 2) and their explanation will be omitted.

On the vibrating arms 131, 132, step parts and detection electrodes are formed in positions near the base part 120 in the respective extending directions thereof. Accordingly, the ranges in which the step parts are formed are referred to as "detection arm parts 150". The configurations of the step parts and the detection electrodes formed on the detection arm parts 150 and the wiring configuration of the detection electrodes are the same as those of embodiment 1 (see FIG. 3), and their explanation will be omitted.

Further, the drive actions of the vibrating arms 131, 132 are the same as those of the first vibrating arm 31 and the second vibrating arm 35 of the above described embodiment 1 (see FIG. 1), and, if the resonator element 110 is rotated around the Y-axis (detection axis) when the vibrating arms 131, 132 perform in-plane vibration, Coriolis force is generated in a direction at a right angle relative to the vibration direction (in-plane vibration) of the vibrating arm 131 and the vibrating arm 132, and the vibrating arm 131 and the vibrating arm 132 perform out-of-plane vibration in the ±Z directions. Therefore, the angular velocity can be detected by the similar action to that of embodiment 1 (see FIGS. 1 and 2).

According to the configuration, because of the double-arm tuning fork having the vibrating arms 131, 132, in the excitation driving, the CI value is lower than that in driving using one vibrating arm of embodiment 2, and the current consumption can be reduced.

Note that the embodiment can be applied not only to the angular velocity sensor but also to a tuning fork resonator that oscillates a natural frequency. In this case, by providing the step parts, the distances between electrodes are narrow and the electric field efficiency is improved, and thus, the vibration loss can be reduced. Further, in related art, the electrodes have been provided on four surfaces of the front and rear surfaces and both side surfaces of the vibrating arms, however, it is necessary to provide only three electrodes in the embodiment, and wiring can be simplified.

Embodiment 4

Subsequently, embodiment 4 will be explained with reference to the drawings. While the above described embodiment 2 and embodiment 3 have the two vibrating arms, embodiment 4 has three vibrating arms and using one of the vibrating arms as a detection arm. Accordingly, the differences from the above described embodiment 1 to embodiment 3 are centered for explanation. The same signs are assigned to the common parts.

Figure 10:
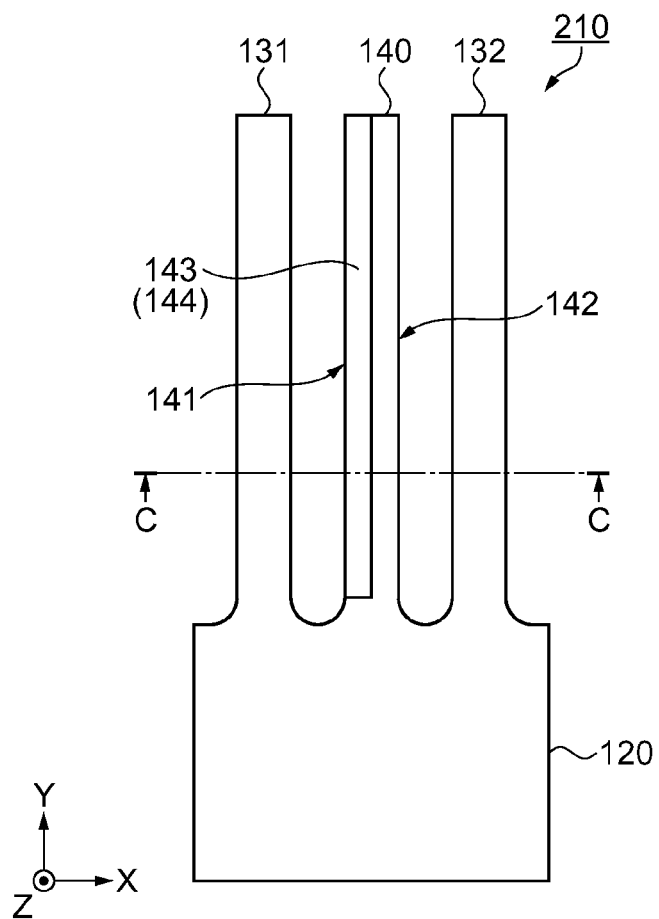
FIG. 10 is a plan view showing a resonator element according to embodiment 4.
Figure 11:
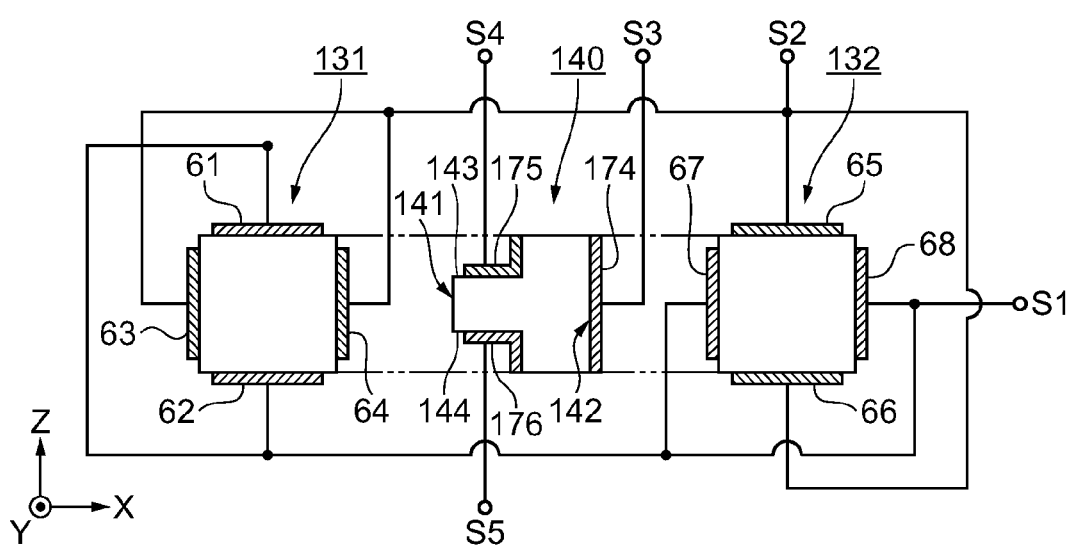
FIG. 11 is a sectional view showing C-C section of FIG. 10.

FIG. 10 is a plan view showing a resonator element according to embodiment 4, and FIG. 11 is a sectional view showing C-C section of FIG. 10. In FIGS. 10 and 11, the resonator element 210 includes three vibrating arms 131, 132, 140 extended from the base part 120 in parallel in the +Y direction.

Here, on the vibrating arms 131, 132, the excitation electrodes are formed, and, on the vibrating arm 140, step parts and detection electrodes are formed. Accordingly, the vibrating arm 140 is a detection arm, and will be referred to as "detection arm 140" for explanation.

Note that the form shown in FIGS. 10, 11 is an example and the positions of the detection arm 140 and the vibrating arm 131 can be exchanged, or the positions of the detection arm 140 and the vibrating arm 132 can be exchanged.

The shapes of the vibrating arms 131, 132 and the configurations and the wiring configurations of the excitation electrodes (electrodes 61 to 68) are the same as those in the above described embodiment 1 (see FIGS. 1, 2) and their explanation will be omitted.

Further, the configurations and the wiring configurations of the first step part 143, the second step part 144, the detection electrodes 174 to 176 formed on the detection arm 140 are the same as those in the above described embodiment 2 (see FIG. 7) and their explanation will be omitted.

When the excitation signals are input to the resonator element 210 having the configuration, the vibrating arms 131, 132 and the detection arm 140 start in-plane vibration. Under the condition, when the reed is rotated around the Y-axis (detection axis), the vibrating arms 131, 132 and the detection arm 140 perform out-of-plane vibration in the alternating directions with each other by Coriolis force, and the angular velocity of the resonator element 210 can be detected by measuring the amounts of charge generated in the detection electrodes 174 to 176.

According to the configuration, because of tuning fork vibration by the two vibrating arms 131, 132, the CI value is lower, and the current consumption can be reduced. Further, since the vibrating arms 131, 132 for excitation and the detection arm 140 are separated, the electrodes 61 to 68 for excitation and the detection electrodes 174 to 176 can be separated, and there are advantages that the planar distances between the respective electrodes can be made larger and the parasitic capacities between the electrodes can be made smaller.

In addition, disconnection and short of the detection electrodes can be suppressed and the manufacturing yield can be improved.

Note that a structure in which the sectional shapes of the vibrating arms are made nearly in H-shapes by forming grooves from the first principal surface 11 and the second principal surface 12 at the centers in the width direction of the vibrating arms has been proposed (for example, JP-A-2004-350324).

Figure 12:
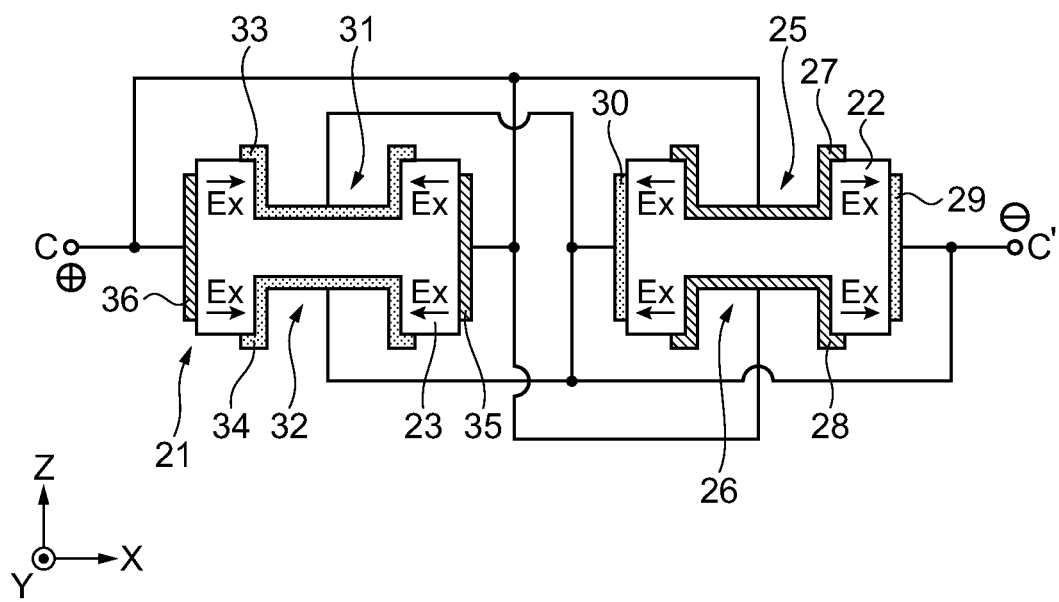
FIG. 12 is a sectional view showing a known technology.

FIG. 12 is a sectional view showing the known technology. Note that FIG. 12 shows a drawing as FIG. 3 of JP-A-2004-350324. However, in the configuration, the inclination of the side surface in the +X direction is larger than the inclination of the side surface in the −X direction because of the difference in etching rates in the +X direction and the −X direction of quartz. That is, the slope in the +X direction is formed as shown in FIG. 5B, and the slope in the −X direction is formed as shown in FIG. 5A.

Accordingly, the distance between opposed electrodes between the electrode 36 and electrodes 33, 34 and the distance between opposed electrodes between the electrode 30 and electrodes 25, 26 are larger. In the case where the configuration is applied to the detection arm, the generated charge becomes smaller due to the larger distances between the opposed electrodes of the detection electrodes, and there is a problem that the detection sensitivity becomes lower. Thus, that shows the configuration having the step parts in the −X direction of the detection arm is more preferable as a detection sensor of the angular velocity.

Embodiment 5

Subsequently, embodiment 5 will be explained with reference to the drawings. While the above described embodiment 2 and embodiment 4 have the vibrating arms extending in parallel to the Y-axis, embodiment 5 has vibrating arms extending obliquely relative to the Y-axis. Accordingly, the differences from the above described embodiment 1 to embodiment 4 are centered for explanation. The same signs are assigned to the common parts.

Figure 13A:
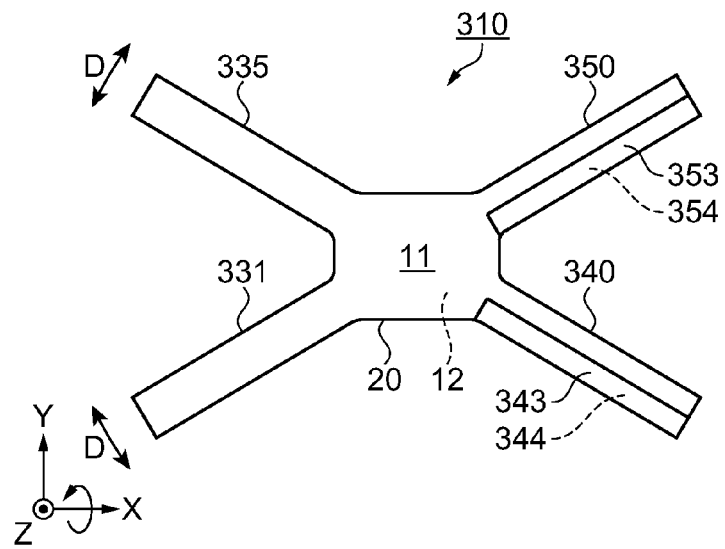
FIGS. 13A, 13B, 13C are plan views showing a resonator element according to embodiment 5.
Figure 13B:
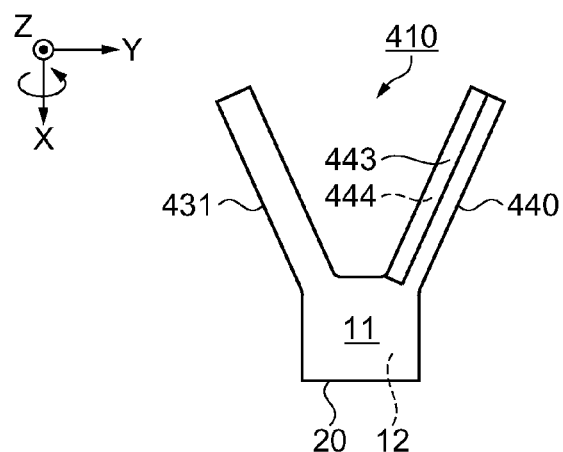
Figure 13C:
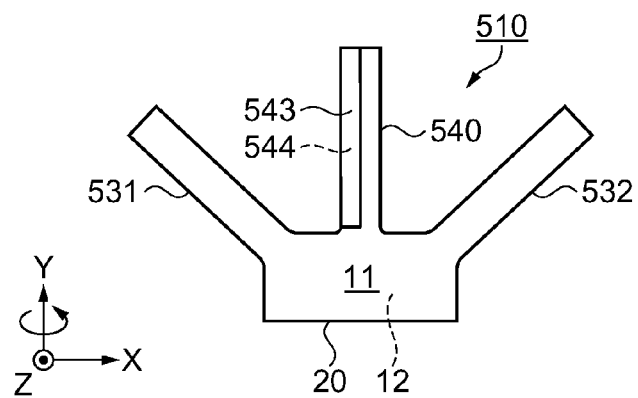

FIGS. 13A to 13C are plan views showing a resonator element according to embodiment 5.

As shown in FIG. 13A, the resonator element 310 includes a first vibrating arm 331 and a second vibrating arm 335 extending from one end of the base part 20 to the −X side along directions intersecting with the X-axis and the Y-axis. Further, the resonator element 310 has a third vibrating arm 340 and a fourth vibrating arm 350 extending from the other end of the base part 20 to the +X side along directions intersecting with the X-axis and the Y-axis.

Here, the first vibrating arm 331 and the third vibrating arm 340, the second vibrating arm 335 and the fourth vibrating arm 350 are provided in positions line-symmetric with respect to the X-axis.

Here, on the first vibrating arm 331 and the second vibrating arm 335, excitation electrodes are formed, and, on the third vibrating arm 340 and the fourth vibrating arm 350, step parts and detection electrodes are formed. Accordingly, the third vibrating arm 340 and the fourth vibrating arm 350 are detection arms, and they will be referred to as the first detection arm 340 and the second detection arm 350 for explanation.

The shapes of the first vibrating arm 331 and the second vibrating arm 335 and the configurations and the wiring configurations of the excitation electrodes are the same as those in the above described embodiment 1 (see FIGS. 1, 2) and their explanation will be omitted.

Further, the configurations and the wiring configurations of first step parts 343, 353 and second step parts 344, 354 and the detection electrodes formed on the first detection arm 340 and the second detection arm 350 are the same as those in the above described embodiment 1 (see FIGS. 1, 3) and their explanation will be omitted.

Here, an outline of movements of the resonator element 310 will be explained.

The first vibrating arm 331 and the second vibrating arm 335 as drive arms are allowed to perform flexural vibration toward the directions intersecting with the X-axis and the Y-axis as shown by arrows D around the root part. Under the condition, if the resonator element 310 is rotated around the X-axis (detection axis), the first vibrating arm 331 and the second vibrating arm 335 perform out-of-plane vibration (flexural vibration in the Z-axis direction) by Coriolis force.

In this regard, the phase of the vibration of the first vibrating arm 331 and the phase of the vibration of the second vibrating arm 335 are the same. In response, the first detection arm 340 and the second detection arm 350 vibrate in phase with each other. On the basis of the respective detection vibrations excited in the first detection arm 340 and the second detection arm 350, charge in phase with each other is generated, and the sum of them is calculated. The angular velocity around the X-axis can be calculated (detected) based on the sum.

As shown in FIG. 13B, the resonator element 410 includes two vibrating arms 431, 440 extending from the base part 20 to the −X side along the directions intersecting with the X-axis and the Y-axis.

The shape of the vibrating arm 431 as a drive arm and the configurations and the wiring configurations of the excitation electrodes are the same as those in the above described embodiment 2 (see FIGS. 6, 7) and their explanation will be omitted.

Further, the configurations and the wiring configurations of a first step part 443, a second step part 444, and the detection electrodes formed on the vibrating arm 440 as a detection arm (hereinafter, referred to as "detection arm 440") are the same as those in the above described embodiment 2 (see FIGS. 6, 7) and their explanation will be omitted.

When the excitation signals are input to the resonator element 410 having the configuration, the vibrating arm 431 and the detection arm 440 start in-plane vibration. Under the condition, when the reed is rotated around the X-axis (detection axis), the vibrating arm 431 and the detection arm 440 perform out-of-plane vibration by Coriolis force, and the angular velocity of the resonator element 410 can be detected by measuring the amounts of charge generated in the detection electrodes.

As shown in FIG. 13C, the resonator element 510 includes two vibrating arms 531, 532 extending from the base part 20 to the +Y side along the directions intersecting with the X-axis and the Y-axis, and a vibrating arm 540 extending to the +Y side along the Y-axis.

Here, on the vibrating arms 531, 532, the excitation electrodes are formed, and, on the vibrating arm. 540, the step parts and the detection electrodes are formed.

The shapes of the vibrating arms 531, 532 and the configurations and the wiring configurations of the excitation electrodes are the same as those in the above described embodiment 2 (see FIGS. 1, 2) and their explanation will be omitted.

Further, the configurations and the wiring configurations of a first step part 543, a second step part 544, and the detection electrodes formed on the vibrating arm 540 as a detection arm (hereinafter, referred to as "detection arm 540") are the same as those in the above described embodiment 2 (see FIG. 7) and their explanation will be omitted.

When the excitation signals are input to the resonator element 510 having the configuration, the vibrating arms 531, 532 and the detection arm 540 start in-plane vibration. Under the condition, when the reed is rotated around the Y-axis (detection axis), the vibrating arms 531, 532 and the detection arm 540 perform out-of-plane vibration by Coriolis force, and the angular velocity of the resonator element 510 can be detected by measuring the amounts of charge generated in the detection electrodes.

Physical Quantity Sensor

Subsequently, an angular velocity sensor as a physical quantity sensor including one of the resonator element 10 to the resonator element 510 in the above described embodiment 1 to embodiment 5 will be explained. Its illustration will be omitted. The angular velocity sensor includes the resonator element according to each of the above described embodiments, an oscillation circuit as an excitation unit configured to excite the vibrating arms of the resonator element within a plane, and a detection circuit as a detection unit configured to detect out-of-plane vibration.

Note that the detection unit includes a noise cancel circuit etc. in addition to an amplifier, an A/D conversion circuit, an arithmetic processing circuit that converts an amount of detected charge into an angular velocity, etc.

According to the configuration, since the above described resonator element having high detection sensitivity is used, an angular velocity sensor with high detection sensitivity can be realized.

The invention is not limited to the above described embodiments, but the invention can include modifications, improvements, etc. within the scope that may achieve the purpose of the invention.

For example, according to the above described embodiment 1 to embodiment 5, the structure with the first step part and the second step part has been exemplified, however, a structure with either the first step part or the second step part can be employed.

Further, the vibrating arms (vibrating arm parts) and the detection arms (detection arm parts) of embodiment 1 to embodiment 5 can be combined.

Resonator

Subsequently, a resonator including the resonator element, for example, a resonator including one of the resonator element 10 to the resonator element 510 according to the above described embodiment 1 to embodiment 5 will be explained.

Figure 14A:
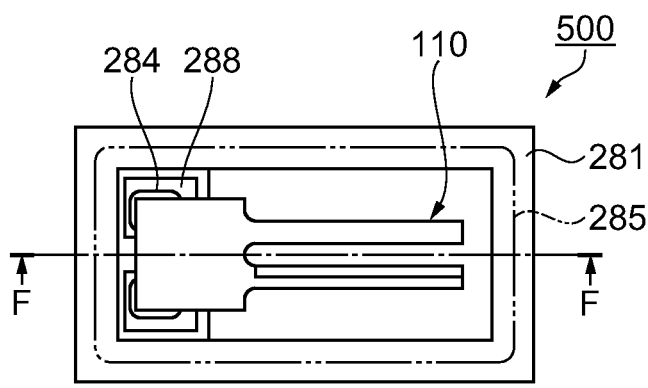
FIGS. 14A and 14B are schematic diagrams showing an overall configuration of a resonator.
Figure 14B:
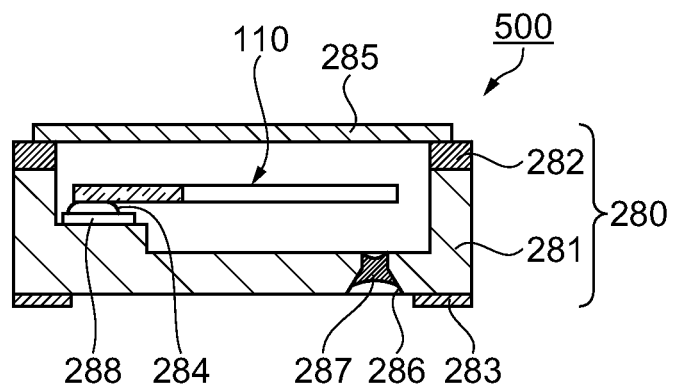

FIGS. 14A and 14B are schematic diagrams showing an overall configuration of a resonator, and FIG. 14A is a plan view and FIG. 14B is a sectional view showing F-F section of FIG. 14A.

As shown in FIGS. 14A and 14B, the resonator 500 includes a resonator element 110 as an example of the above described respective resonator elements, and a package 280 containing the resonator element 110.

The package 280 includes a package base 281, a seam ring 282, a lid body 285, etc.

In the package base 281, a recess part for holding the resonator element 110 is formed and a connection pad 288 connected to a mount electrode (not shown) of the resonator element 110 is provided in the recess part.

The connection pad 288 is connected to the wiring within the package base 281, and is adapted to be in conduction with an external connection terminal 283 provided in the outer peripheral part of the package base 281.

Around the recess part of the package base 281, the seam ring 282 is provided. Further, on the bottom part of the package base 281, a through hole 286 is provided.

The resonator element 110 is bonded and fixed to the connection pad 288 of the package base 281 via a conducting adhesive 284. Further, in the package 280, the lid part 285 covering the recess part of the package base 281 and the seam ring 282 are seam-welded.

The through hole 286 of the package base 281 is filled with a sealing material 287 of a metal material or the like. The sealing material 287 is melted and solidified in a decompressed atmosphere for air-tightly sealing the through hole 286 in order to hold the decompressed state within the package base 281.

Note that the package may include a flat plate-like package base and a lid having a recess part. Further, the package may have recess parts on both the package base and the lid.

In the resonator 500, the resonator element 110 is excited by an external drive signal via the external connection terminal 283, and the resonator vibrates (resonates) at a predetermined frequency (for example, 32 kHz).

As described above, since the resonator 500 includes the resonator element 110, the resonator with the improved electric field efficiency can be realized.

Note that the resonator 500 may exert the same effect even including the above described other resonator element in place of the resonator element 110.

Electronic Equipment

Subsequently, electronic equipment including the above described resonator element will be explained. Note that its illustration will be omitted.

The resonator element may preferably be used as a sensing device or a timing device for electronic equipment such as a digital still camera, a video camera, a navigation system, a pointing device, a game controller, a cellular phone, an electronic book, a personal computer, a television, a video recorder, a pager, an electronic organizer, a calculator, a word processor, a work station, a video phone, a POS terminal, and equipment having a touch panel, and electronic equipment that exerts effects explained in the above described embodiments and modified example can be provided in any case.

The entire disclosure of Japanese Patent Application No. 2009-280173, filed Dec. 10, 2009 and No. 2010-225423, filed Oct. 5, 2010 are expressly incorporated by reference herein.

What is claimed is:

1. A resonator element comprising:
    a base part;
    plural vibrating arms extended from the base part, each having a first principal surface and a second principal surface opposed to each other and a first side surface and a second side surface connecting the first principal surface and the second principal surface and opposed to each other, the first side surface of at least one vibrating arm of the plural vibrating arms having a first step part provided from the first principal surface side and a second step part provided from the second principal surface side;
    a first electrode provided on the second side surface of the vibrating arm;
    a second electrode provided in a position opposed to the first electrode of the first step part; and
    a third electrode provided in a position opposed to the first electrode of the second step part, wherein the first, second and third electrodes are electrically isolated from each other.

2. The resonator element according to claim 1, wherein a direction of an electric field generated between the first electrode and the second electrode and a direction of an electric field generated between the first electrode and the third electrode are opposite to each other.

3. The resonator element according to claim 1, wherein the vibrating arm includes excitation electrodes and detection electrodes, and the first electrode to the third electrode are used for the detection electrodes.

4. The resonator element according to claim 1, wherein two of the vibrating arms are extended from one end part of the base part and the other end part opposed to the one end part, respectively.

5. The resonator element according to claim 1, wherein an etching rate is higher at the first side surface side than at the second side surface side.

6. The resonator element according to claim 1, wherein, in each of the plural vibrating arms, the first step part and the second step part are provided on the first side surface.

7. A resonator comprising:
    the resonator element according claim 1; and
    a package containing the resonator element.

8. A physical quantity sensor comprising the resonator element according to claim 1.

9. Electronic equipment comprising the resonator element according to claim 1.

10. A resonator comprising:
    the resonator element according to claim 2; and
    a package containing the resonator element.

11. A resonator comprising:
    the resonator element according to claim 3; and
    a package containing the resonator element.

12. A resonator comprising:
    the resonator element according to claim 4; and
    a package containing the resonator element.

13. A resonator comprising:
    the resonator element according to claim 5; and
    a package containing the resonator element.

14. A resonator comprising:
    the resonator element according to claim 6; and
    a package containing the resonator element.

* * * * *